United States Patent
Mochida et al.

(10) Patent No.: US 8,593,888 B2
(45) Date of Patent: Nov. 26, 2013

(54) SEMICONDUCTOR MEMORY DEVICE

(75) Inventors: Reiji Mochida, Osaka (JP); Takafumi Maruyama, Osaka (JP); Yukimasa Hamamoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/591,766

(22) Filed: Aug. 22, 2012

(65) Prior Publication Data

US 2012/0314515 A1 Dec. 13, 2012

Related U.S. Application Data

(63) Continuation of application No. PCT/JP2010/007402, filed on Dec. 21, 2010.

(30) Foreign Application Priority Data

Mar. 10, 2010 (JP) ................................. 2010-052722

(51) Int. Cl.
*G11C 5/14* (2006.01)
(52) U.S. Cl.
USPC .................................. 365/189.09; 365/185.18
(58) Field of Classification Search
USPC ........................................ 365/189.09, 185.18
See application file for complete search history.

(56) References Cited

U.S. PATENT DOCUMENTS 7,428,170 B2 * 9/2008 Lee ........................... 365/185.19

FOREIGN PATENT DOCUMENTS

JP 2008-217914 A 9/2008

OTHER PUBLICATIONS

International Search Report issued in International Patent Application No. PCT/JP2010/007402 dated Mar. 22, 2011.

* cited by examiner

*Primary Examiner* — Huan Hoang
(74) *Attorney, Agent, or Firm* — McDermott Will & Emery LLP

(57) ABSTRACT

In a semiconductor memory device, the output of a regulator is coupled to the inputs of first and second switches, the output of the first switch is coupled to a path for supplying the drain voltage of a memory cell in the first mode, and the output of the second switch is coupled to a path for supplying the gate voltage of the memory cell in the second mode. A fourth switch is placed in parallel with the second switch: the output of the fourth switch is coupled to the output of the second switch, to supply the gate voltage of the memory cell in the first mode. Thus, one regulator is used as both the regulator for the drain voltage of the memory cell and the regulator for the gate voltage of the memory cell.

21 Claims, 5 Drawing Sheets

SEMICONDUCTOR MEMORY DEVICE

CROSS-REFERENCE TO RELATED APPLICATION

This is a continuation of PCT International Application PCT/JP2010/007402 filed on Dec. 21, 2010, which claims priority to Japanese Patent Application No. 2010-052722 filed on Mar. 10, 2010. The disclosures of these applications including the specifications, the drawings, and the claims are hereby incorporated by reference in their entirety.

BACKGROUND

The present disclosure relates to semiconductor memory devices, and more particularly to nonvolatile memory such as electrically erasable programmable read only memory (EEPROM).

In EEPROM, the memory contents in memory cells can be erased and rewritten using electric signals. In specific write operation, hot carrier injection (HCI) is used in some cases. In such cases, the output of a first regulator is coupled to the gate of a memory cell, and also the output of a second regulator is coupled to the gate of a voltage applying transistor, so that the gate voltage of the memory cell is regulated while a voltage is applied from the drain terminal of the voltage applying transistor to the drain terminal of the memory cell. A technique like this is described in Japanese Patent Publication No. 2008-217914 (FIG. 9), for example.

SUMMARY

In the conventional circuit configuration described above, two regulators are necessary, one for the drain voltage of the memory cell and the other for the gate voltage thereof, because the required output voltage ranges and precisions for these voltages are different, and this poses a problem of increasing the circuit area.

To overcome the above problem, according to the present disclosure, the two regulators are combined, and when the voltage applied from the drain terminal of the voltage applying transistor to the drain terminal of the memory cell is regulated by the regulator, the gate voltage of the memory cell is applied without intervention of a regulator.

Specifically, a first semiconductor memory device of the present disclosure is a semiconductor memory device capable of erasing and writing memory contents in a memory cell using an electric signal, including the memory cell, one regulator, first and second switches, and a voltage applying transistor for applying a voltage to the memory cell, wherein an output of the regulator is coupled to inputs of the first and second switches, an output of the first switch is coupled to a gate of the voltage applying transistor, a voltage is applied from a drain terminal of the voltage applying transistor to a drain terminal of the memory cell, and an output of the second switch is coupled to a gate of the memory cell for application of a voltage.

A second semiconductor memory device of the present disclosure is a semiconductor memory device capable of erasing and writing memory contents in a memory cell using an electric signal, including the memory cell, one regulator, second and third switches, and a voltage applying transistor, wherein an output of the regulator is coupled to an input of the second switch and a gate of the voltage applying transistor, a voltage is applied from a drain terminal of the voltage applying transistor to a drain terminal of the memory cell via the third switch, and an output of the second switch is coupled to a gate of the memory cell for application of a voltage.

A third semiconductor memory device of the present disclosure is the first semiconductor memory device, wherein an output of a fourth switch is coupled to the output of the second switch, and a voltage different from the output of the regulator is applied to the gate of the memory cell.

A fourth semiconductor memory device of the present disclosure is the second semiconductor memory device, wherein an output of a fourth switch is coupled to the output of the second switch, and a voltage different from the output of the regulator is applied to the gate of the memory cell.

A fifth semiconductor memory device of the present disclosure is the third semiconductor memory device, wherein, in a first operation mode, the first and fourth switches are turned on, allowing the output voltage of the regulator to be applied to the drain terminal of the memory cell and the voltage different from the output of the regulator to be applied to the gate of the memory cell, and in a second operation mode, the second switch is turned on, allowing the output voltage of the regulator to be applied to the gate of the memory cell.

A sixth semiconductor memory device of the present disclosure is the fourth semiconductor memory device, wherein, in a first operation mode, the third and fourth switches are turned on, allowing the output voltage of the regulator to be applied to the drain terminal of the memory cell and the voltage different from the output of the regulator to be applied to the gate of the memory cell, and in a second operation mode, the second switch is turned on, allowing the output voltage of the regulator to be applied to the gate of the memory cell.

A seventh semiconductor memory device of the present disclosure is the first or third semiconductor memory device, further including fifth and sixth switches, a grounding transistor, a sense amplifier, and a voltage generator circuit, wherein an input of the fifth switch is coupled between the drain terminal of the voltage applying transistor and the drain terminal of the memory cell, and an input of the sense amplifier is coupled to an output of the fifth switch, a source terminal of the memory cell is grounded via the grounding transistor, an output of the sixth switch is coupled between the source terminal of the memory cell and the grounding transistor, and an output of the voltage generator circuit is coupled to an input of the sixth switch.

An eighth semiconductor memory device of the present disclosure is the second or fourth semiconductor memory device, further including fifth and sixth switches, a grounding transistor, a sense amplifier, and a voltage generator circuit, wherein an input of the fifth switch is coupled between the third switch and the drain terminal of the memory cell, and an input of the sense amplifier is coupled to an output of the fifth switch, a source terminal of the memory cell is grounded via the grounding transistor, an output of the sixth switch is coupled between the source terminal of the memory cell and the grounding transistor, and an output of the voltage generator circuit is coupled to an input of the sixth switch.

A ninth semiconductor memory device of the present disclosure is the first or third semiconductor memory device, further including fifth and sixth switches, a grounding transistor, a sense amplifier, and a voltage generator circuit, wherein an output of the fifth switch is coupled between the drain terminal of the voltage applying transistor and the drain terminal of the memory cell, and an output of the voltage generator circuit is coupled to an input of the fifth switch, a source terminal of the memory cell is grounded via the grounding transistor, an input of the sixth switch is coupled between the source terminal of the memory cell and the grounding transistor, and an input of the sense amplifier is coupled to an output of the sixth switch.

A tenth semiconductor memory device of the present disclosure is the second or fourth semiconductor memory device, further including fifth and sixth switches, a grounding transistor, a sense amplifier, and a voltage generator circuit, wherein an output of the fifth switch is coupled between the third switch and the drain terminal of the memory cell, and an output of the voltage generator circuit is coupled to an input of the fifth switch, a source terminal of the memory cell is grounded via the grounding transistor, an input of the sixth switch is coupled between the source terminal of the memory cell and the grounding transistor, and an input of the sense amplifier is coupled to an output of the sixth switch.

An eleventh semiconductor memory device of the present disclosure is the first or third semiconductor memory device, further including a fifth switch, a sense amplifier, and a voltage generator circuit, wherein an output of the fifth switch is coupled between the drain terminal of the voltage applying transistor and the drain terminal of the memory cell, and an output of the voltage generator circuit and an input of the sense amplifier are coupled to an input of the fifth switch, and a source terminal of the memory cell is grounded.

A twelfth semiconductor memory device of the present disclosure is the second or fourth semiconductor memory device, further including a fifth switch, a sense amplifier, and a voltage generator circuit, wherein an output of the fifth switch is coupled between the third switch and the drain terminal of the memory cell, and an output of the voltage generator circuit and an input of the sense amplifier are coupled to an input of the fifth switch, and a source terminal of the memory cell is grounded.

A thirteenth semiconductor memory device of the present disclosure is the seventh semiconductor memory device, wherein in a first operation mode, the first and fourth switches and the grounding transistor are turned on, allowing the output voltage of the regulator to be applied to the drain terminal of the memory cell, the voltage different from the output of the regulator to be applied to the gate of the memory cell, and a source of the memory cell to be grounded, and in a second operation mode, the second, fifth, and sixth switches are turned on, allowing the input of the sense amplifier to be coupled to the drain terminal of the memory cell, the output voltage of the regulator to be applied to the gate of the memory cell, and the output voltage of the voltage generator circuit to be applied to the source of the memory cell.

A fourteenth semiconductor memory device of the present disclosure is the eighth semiconductor memory device, wherein in a first operation mode, the third and fourth switches and the grounding transistor are turned on, allowing the output voltage of the regulator to be applied to the drain terminal of the memory cell, the voltage different from the output of the regulator to be applied to the gate of the memory cell, and a source of the memory cell to be grounded, and in a second operation mode, the second, fifth, and sixth switches are turned on, allowing the input of the sense amplifier to be coupled to the drain terminal of the memory cell, the output voltage of the regulator to be applied to the gate of the memory cell, and the output voltage of the voltage generator circuit to be applied to the source of the memory cell.

A fifteenth semiconductor memory device of the present disclosure is the ninth semiconductor memory device, wherein in a first operation mode, the first and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and in a second operation mode, the second, fifth, and sixth switches are turned on, allowing the output voltage of the voltage generator circuit to be applied to the drain terminal of the memory cell, the output voltage of the regulator to be applied to the gate of the memory cell, and the input of the sense amplifier to be coupled to the source terminal of the memory cell.

A sixteenth semiconductor memory device of the present disclosure is the tenth semiconductor memory device, wherein in a first operation mode, the third and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and in a second operation mode, the second, fifth, and sixth switches are turned on, allowing the output voltage of the voltage generator circuit to be applied to the drain terminal of the memory cell, the output voltage of the regulator to be applied to the gate of the memory cell, and the input of the sense amplifier to be coupled to the source terminal of the memory cell.

A seventeenth semiconductor memory device of the present disclosure is the eleventh semiconductor memory device, wherein in a first operation mode, the first and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and in a second operation mode, the second and fifth switches are turned on, allowing the output voltage of the voltage generator circuit to be applied to the drain terminal of the memory cell, as well as the input of the sense amplifier to be coupled to the drain terminal of the memory cell, and the output voltage of the regulator to be applied to the gate of the memory cell.

An eighteenth semiconductor memory device of the present disclosure is the twelfth semiconductor memory device, wherein in a first operation mode, the third and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and in a second operation mode, the second and fifth switches are turned on, allowing the output voltage of the voltage generator circuit to be applied to the drain terminal of the memory cell, as well as the input of the sense amplifier to be coupled to the drain terminal of the memory cell, and the output voltage of the regulator to be applied to the gate of the memory cell.

Preferably, the first operation mode represents write into the memory cell, and the second operation mode represents read of memory cell information.

Preferably, the voltage different from the output of the regulator is an output voltage of a booster circuit.

Preferably, an output of a booster circuit is coupled to a source terminal of the voltage applying transistor.

As described above, according to the present disclosure, in the first mode (e.g., during write operation), while a voltage that has not been regulated is directly applied to the gate of the memory cell, the output of the regulator is supplied to the gate of the voltage applying transistor, to control the voltage applied to the drain side of the memory cell with the output voltage of the regulator. In the second mode (e.g., during read operation), the output of the regulator is supplied to the gate of the memory cell, to control the gate voltage of the memory cell.

Therefore, since the gate voltage of the memory cell is a voltage applied without intervention of a regulator in the first mode, the regulator for application of the drain voltage of the memory cell used in the first mode and the regulator for the gate voltage of the memory cell used in the second mode can be combined as one regulator. Thus, a small-area semiconductor memory device can be provided.

As described above, according to the present disclosure, one regulator can serve as the regulator for the drain voltage of the memory cell used in the first mode and the regulator for the gate voltage of the memory cell used in the second mode, so that a small-area semiconductor memory device can be provided.

DETAILED DESCRIPTION

Embodiments of the present disclosure will be described hereinafter.

(First Embodiment)

Figure 1:
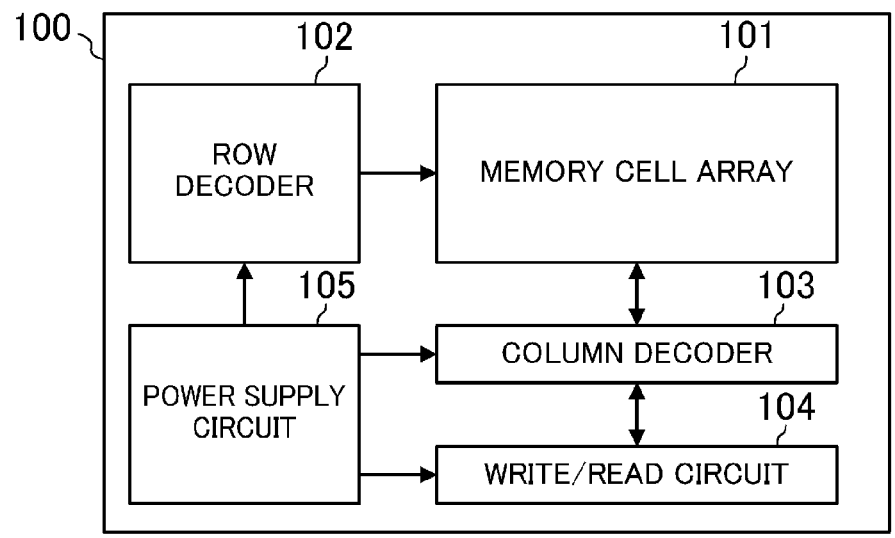
FIG. 1 is a block diagram of a semiconductor memory device of the first embodiment of the present disclosure.

FIG. 1 is a block diagram of a semiconductor memory device of the first embodiment of the present disclosure. As shown in FIG. 1, the semiconductor memory device 100, which is a semiconductor memory device capable of erasing and writing memory contents in memory cells using electric signals, includes a memory cell array 101, a row decoder 102, a column decoder 103, a write/read circuit 104, and a power supply circuit 105.

The memory cell array 101 has a plurality of electrically rewritable memory cells placed at intersections of bit lines and word lines. Such memory cells are arranged in a matrix.

The power supply circuit 105 supplies voltages to the row decoder 102, the column decoder 103, and the write/read circuit 104.

The row decoder 102 applies a voltage supplied from the power supply circuit 105 to selected memory cells. The column decoder 103 applies a voltage supplied from the write/read circuit 104 to selected memory cells. The column decoder 103 also outputs information in memory cells to the write/read circuit 104 during read operation. The write/read circuit 104 outputs the voltage supplied from the power supply circuit 105 to the column decoder 103, and also has a function of determining the state of memory cells based on the memory cell information received from the column decoder 103 during read operation.

Figure 2:
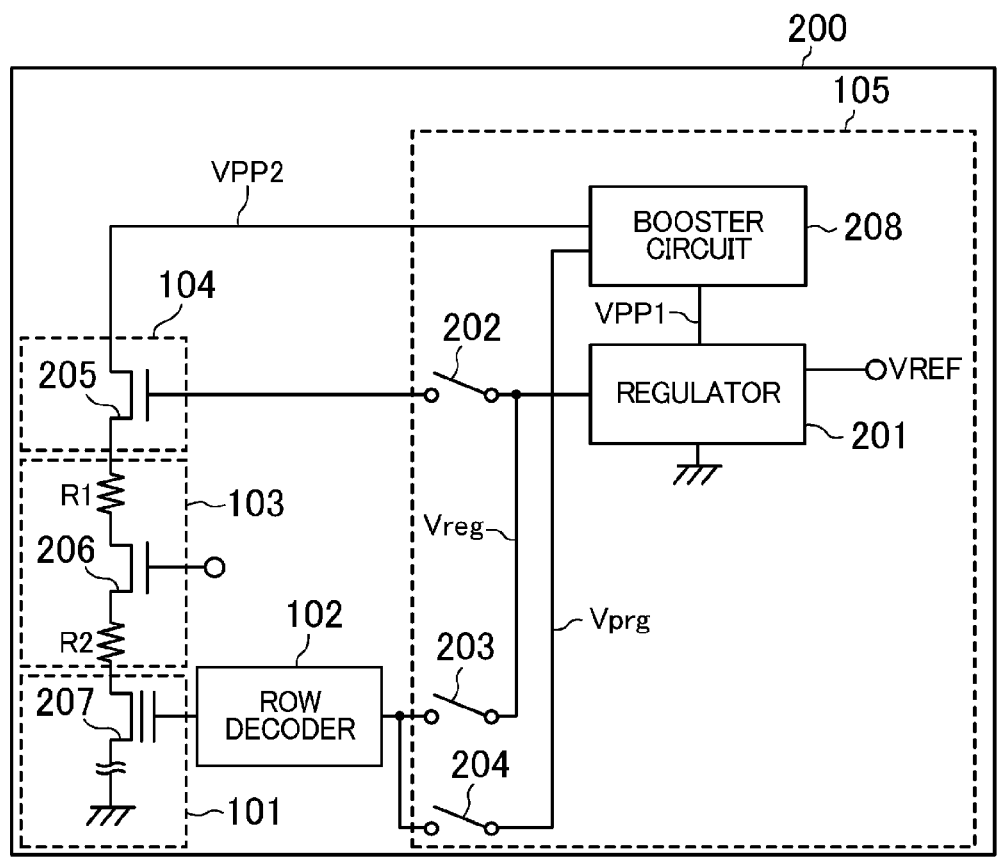
FIG. 2 is a circuit diagram showing a relevant part of the semiconductor memory device of the first embodiment.

FIG. 2 is a circuit diagram showing part of the semiconductor memory device 100 of FIG. 1. Although a plurality of memory cells 207 are arranged in the memory cell array 101 and a plurality of selective transistors 206 are arranged in the column decoder 103, only part of them are shown in FIG. 2. R1 and R2 respectively denote a parasitic resistance between the memory cell 207 and the selective transistor 206 and a parasitic resistance between the selective transistor 206 and a voltage applying transistor 205 of the write/read circuit 104. The drain terminal of the voltage applying transistor 205 is coupled to an output voltage VPP2 of a booster circuit 208 of the power supply circuit 105, and the source terminal of the memory cell 207 is coupled to the ground potential via a switch (not shown).

In the power supply circuit 105, a regulator 201 is coupled to an output voltage VPP1 of the booster circuit 208, and the output of the regulator 201 is coupled to the inputs of a first switch 202 and a second switch 203. The output of the first switch 202 is coupled to the gate of the voltage applying transistor 205 that applies a voltage to the drain side of the memory cell 207. By regulating this gate voltage, the voltage applied to the drain side of the memory cell 207 can be controlled. Likewise, the output of the second switch 203 is coupled to the gate of the memory cell 207 via the row decoder 102. By regulating this gate voltage, the voltage applied to the gate of the memory cell 207 can be controlled. Also, a voltage Vprg output from the booster circuit 208 can be applied to the gate of the memory cell 207 via a fourth switch 204 the output of which is coupled to the output of the second switch 203.

No limitation is posed on the magnitude relations among the output voltages VPP1, VPP2, and Vprg of the booster circuit 208, and appropriate voltages are set according to the characteristics of the memory cell 207. Alternatively, the output voltages VPP1, VPP2, and Vprg of the booster circuit 208 may be supplied from outside directly. Also, a plurality of booster circuits 208 may be provided.

Next, the operation in this embodiment will be described specifically. In the first mode, the fourth switch 204 is turned on, allowing the voltage Vprg to be applied to the gate of the memory cell 207 via the row decoder 102. Also, the first switch 202 is turned on and the second switch 203 is turned off, whereby an output voltage Vreg of the regulator 201 is coupled to the gate of the voltage applying transistor 205, and a voltage obtained by controlling the boosted voltage VPP2 with the output voltage Vreg of the regulator 201 is applied to the drain side of the memory cell 207 via the parasitic resistances R1 and R2 and the selective transistor 206.

In the second mode, the first switch 202 is turned off, the second switch 203 is turned on, and the fourth switch 204 is turned off, allowing the output voltage Vreg of the regulator 201 to be applied to the gate of the memory cell 207 via the row decoder 102.

The first mode represents write operation, and the second mode represents read operation.

Figure 3:
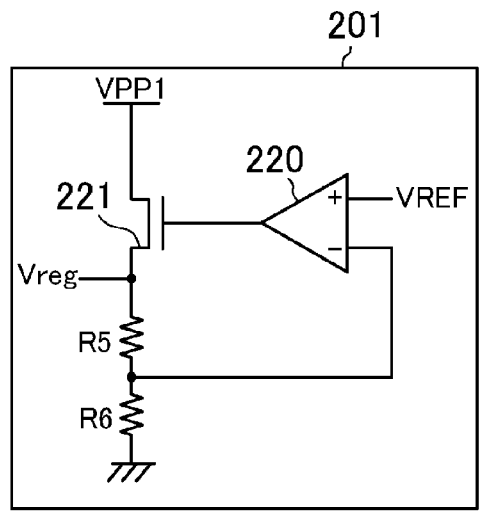
FIG. 3 is a view showing a specific configuration of a regulator of the semiconductor device of the first embodiment.

FIG. 3 shows a specific configuration of the regulator 201. Referring to FIG. 3, a reference voltage VREF is applied to one of the input terminals of an operational amplifier 220, and resistance elements R5 and R6 are coupled to the other input terminal. The output of the operational amplifier 220 drives the gate of an output transistor 221, to allow output of the voltage Vreg.

(Second Embodiment)

Next, the second embodiment of the present disclosure will be described.

Figure 4:
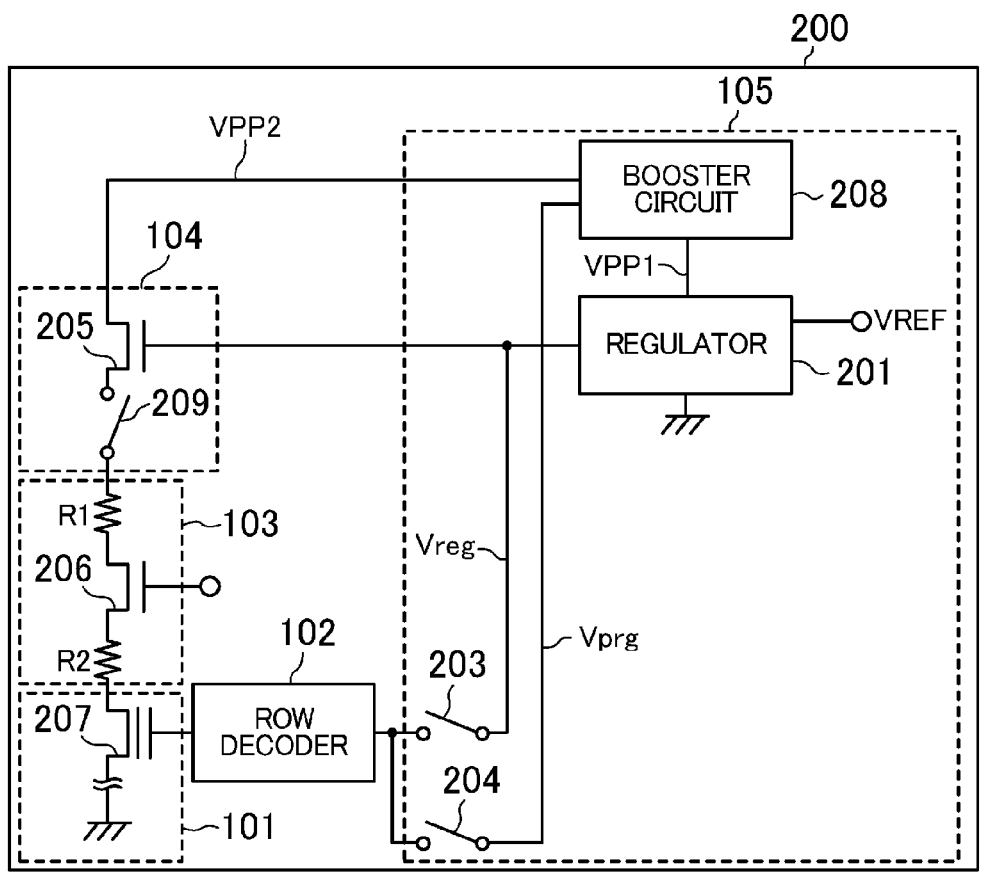
FIG. 4 is a view showing a configuration of a relevant part of a semiconductor memory device of the second embodiment of the present disclosure.

FIG. 4 is a circuit diagram showing the second embodiment. The configuration of the second embodiment is different from that of the first embodiment in that the output voltage Vreg of the regulator 201 is directly applied to the voltage applying transistor 205 and that the voltage on the drain side of the memory cell 207 is controlled with a third switch 209. The other configuration is the same as that of the first embodiment.

The operation in this embodiment will be described specifically. In the first mode, the third switch 209 is turned on, the fourth switch 204 is turned on, and the second switch 203 is turned off, whereby the voltage Vprg is applied to the gate of the memory cell 207 via the row decoder 102, the output voltage Vreg of the regulator 201 is coupled to only the gate of the voltage applying transistor 205, and a voltage obtained by controlling the boosted voltage VPP2 with the output voltage Vreg of the regulator 201 is applied to the drain side of the memory cell 207 via the parasitic resistances R1 and R2 and the selective transistor 206.

In the second mode, the third switch 209 is turned off, the second switch 203 is turned on, and the fourth switch 204 is turned off, allowing the output voltage Vreg of the regulator 201 to be applied to the gate of the memory cell 207 via the row decoder 102.

The first mode represents write operation, and the second mode represents read operation.

(Third Embodiment)

Figure 5:
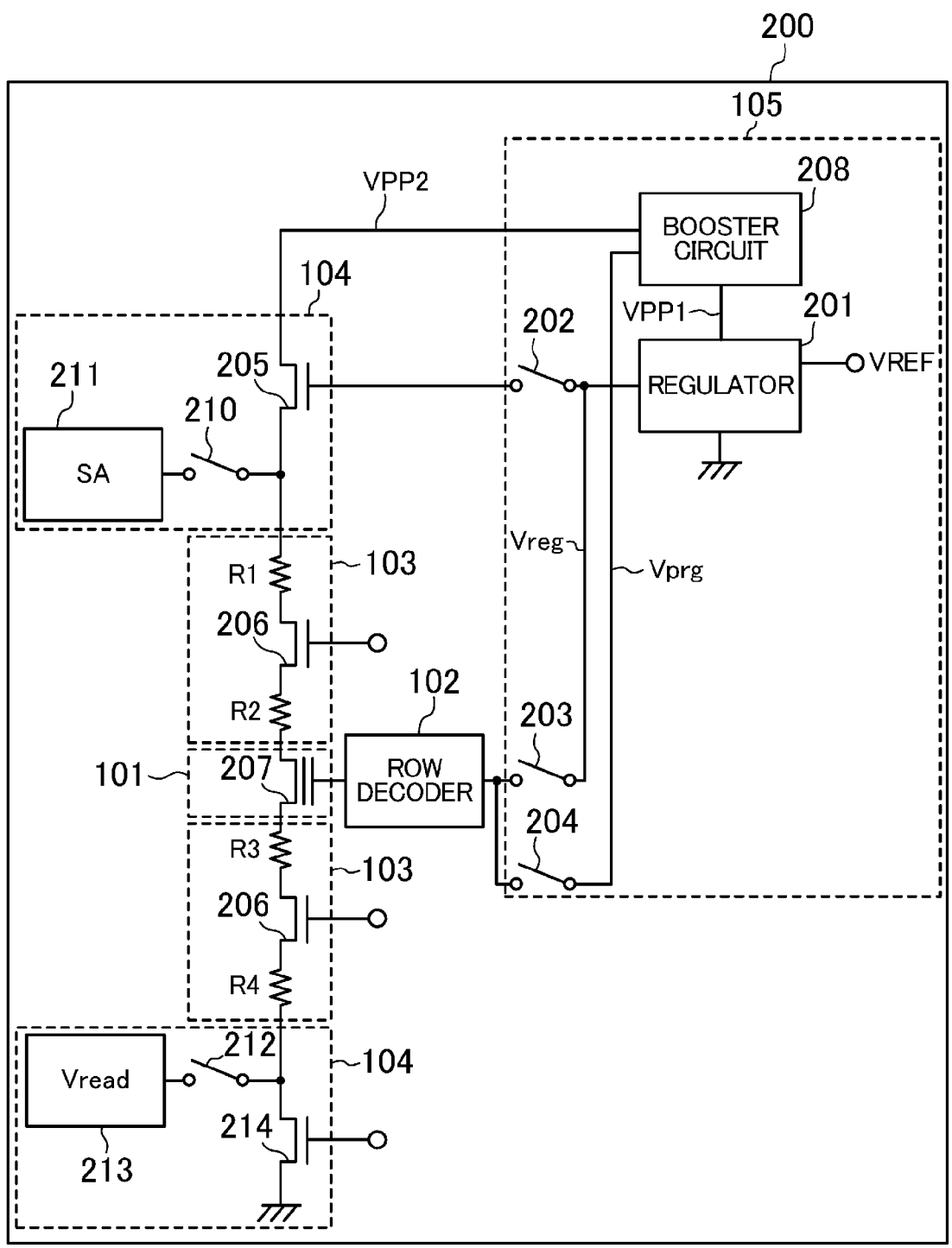
FIG. 5 is a view showing a configuration of a relevant part of a semiconductor memory device of the third embodiment of the present disclosure.

FIG. 5 is a circuit diagram showing the third embodiment.

Although a plurality of memory cells 207 are arranged in the memory cell array 101 and a plurality of selective transistors 206 are arranged in the column decoder 103, only part of them are shown in FIG. 5. R1, R2, R3, and R4 denote parasitic resistances between the selective transistors 206 related to the memory cell 207. The drain side of the memory cell 207 is coupled to the write/read circuit 104 via the parasitic resistances R1 and R2 and the selective transistor 206. In the write/read circuit 104, whether to be applied with a voltage via the voltage applying transistor 205 or to be coupled to a sense amplifier 211 via a fifth switch 210 is selectable. Likewise, the source side of the memory cell 207 is coupled to the write/read circuit 104 via the parasitic resistances R3 and R4 and the selective transistor 206. In the write/read circuit 104, whether to be coupled to the ground potential via a grounding transistor 214 or to be applied with a voltage Vread generated by a voltage generator circuit 213 via a sixth switch 212 is selectable.

The output of the regulator 201 coupled to the output voltage VPP1 of the booster circuit 208 is coupled to the inputs of the first and second switches 202 and 203. The output of the first switch 202 is coupled to the gate of the voltage applying transistor 205 that applies a voltage to the drain side of the memory cell 207. By regulating this gate voltage, the voltage to be applied to the drain side of the memory cell 207 can be controlled. Likewise, the output of the second switch 203 is coupled to the gate of the memory cell 207 via the row decoder 102. By regulating this gate voltage, the voltage to be applied to the gate of the memory cell 207 can be controlled. Also, the voltage Vprg output from the booster circuit 208 can be applied to the gate of the memory cell 207 via the fourth switch 204 the output of which is coupled to the output of the second switch 203.

No limitation is posed on the magnitude relations among the output voltages VPP1, VPP2, and Vprg of the booster circuit 208. Appropriate voltage values are set for these voltages according to the characteristics of the memory cell 207. Alternatively, the out voltages VPP1, VPP2, and Vprg of the booster circuit 208 may be supplied from outside directly. Also, a plurality of booster circuits 208 may be provided.

Next, the operation in this embodiment will be described specifically. In the first mode, the fourth switch 204 is turned on, the first switch 202 is turned on, the second switch 203 is turned off, the fifth switch 210 is turned off, the sixth switch 212 is turned off, and the grounding transistor 214 is turned on, allowing the voltage Vprg to be applied to the gate of the memory cell 207 via the row decoder 102. Also, the output voltage Vreg of the regulator 201 is applied to the gate of the voltage applying transistor 205, and a voltage obtained by controlling the boosted voltage VPP2 with the output voltage Vreg of the regulator 201 is applied to the drain side of the memory cell 207 via the parasitic resistances R1 and R2 and the selective transistor 206. The source side of the memory cell 207 is coupled to the ground potential.

In the second mode, the first switch 202 is turned off, the second switch 203 is turned on, the fourth switch 204 is turned off, the fifth switch 210 is turned on, the sixth switch 212 is turned on, and the grounding transistor 214 is turned off, allowing the output voltage Vreg of the regulator 201 to be applied to the gate of the memory cell 207 via the row decoder 102. Also, with the voltage applying transistor 205 being off, the drain side of the memory cell 207 is coupled to the sense amplifier 211 via the parasitic resistances R1 and R2 and the selective transistor 206. Moreover, the voltage Vread generated by the voltage generator circuit 213 is supplied to the source side of the memory cell 207 via the parasitic resistances R3 and R4 and the selective transistor 206.

The first mode represents write operation, and the second mode represents read operation.

(Fourth Embodiment)

Figure 6:
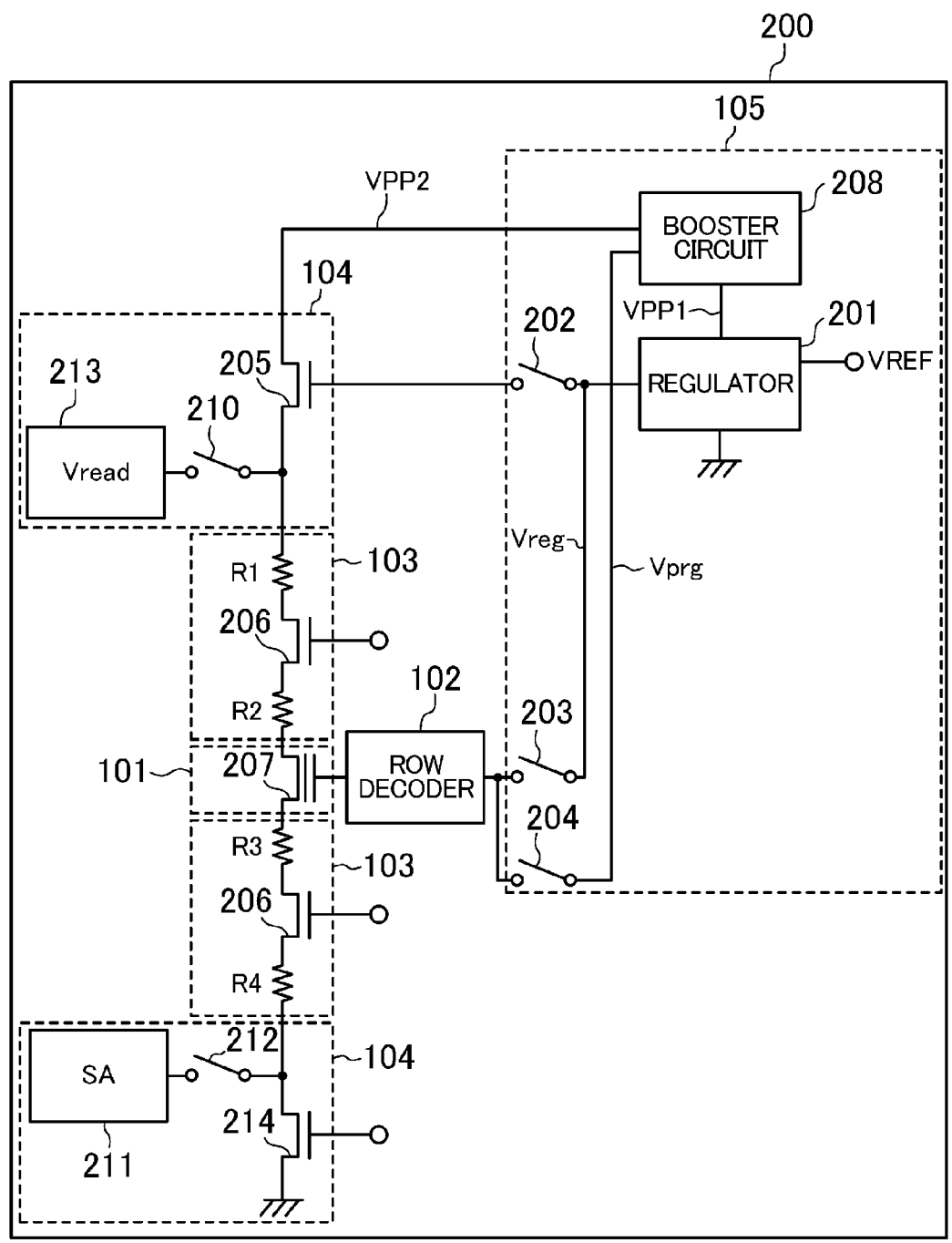
FIG. 6 is a view showing a configuration of a relevant part of a semiconductor memory device of the fourth embodiment of the present disclosure.

FIG. 6 shows the fourth embodiment of the present disclosure.

The configuration of the fourth embodiment is different from that of the third embodiment in that the voltage generator circuit 213 is coupled to the input of the fifth switch 210 and that the sense amplifier 211 is coupled to the input of the sixth switch 212. The other configuration is the same as that of the third embodiment.

This embodiment is advantageous for a device operated by switching bias conditions for the memory cells 207 from one to another during read operation, such as storing two units of information in one memory cell 207.

Note that the third and fourth embodiments can also be implemented using the configuration of the second embodiment using the third switch 209.

(Fifth Embodiment)

Figure 7:
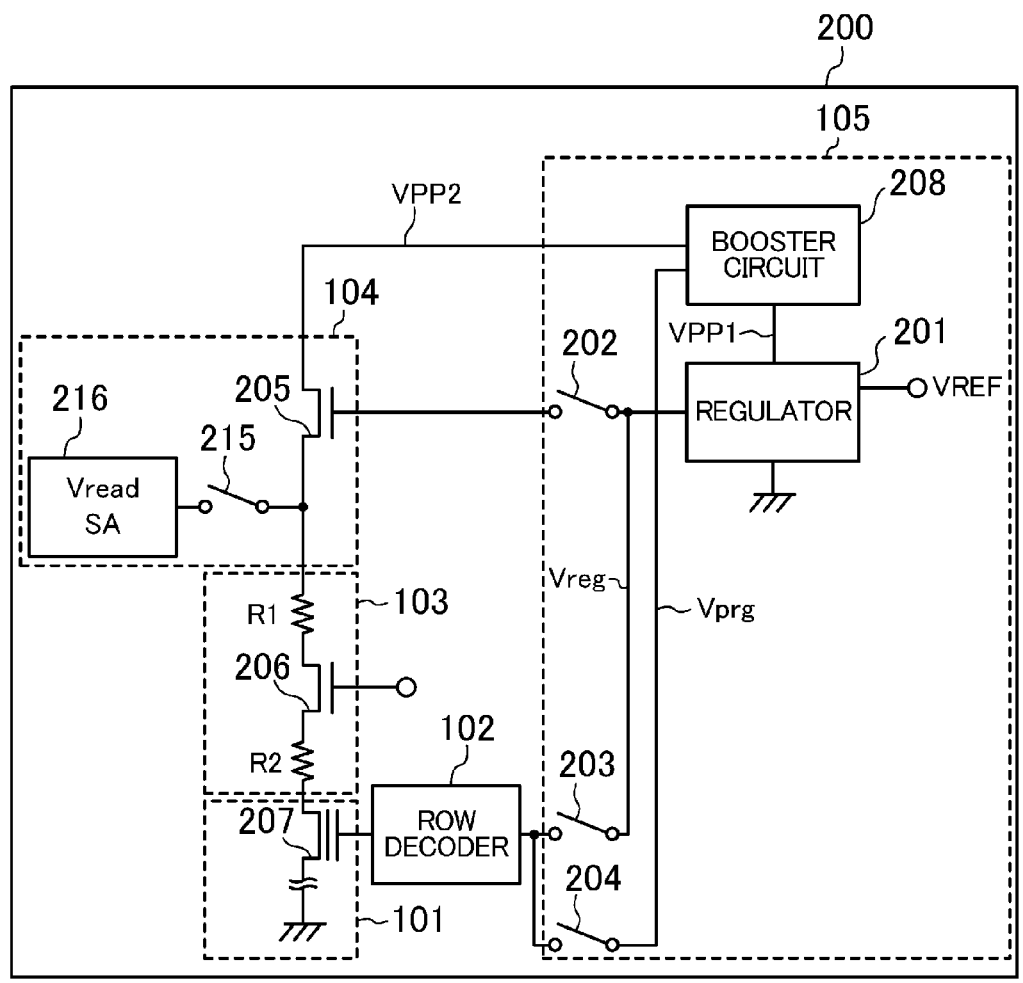
FIG. 7 is a view showing a configuration of a relevant part of a semiconductor memory device of the fifth embodiment of the present disclosure.

FIG. 7 shows the fifth embodiment of the present disclosure.

Referring to FIG. 7, the output of a fifth switch 215 is coupled to the drain terminal of the voltage applying transistor 205, and the input of the fifth switch 215 is coupled to a circuit block 216 having a voltage generator circuit and a sense amplifier. The other configuration is the same as that of the first embodiment shown in FIG. 2.

The operation in this embodiment will be described specifically. In the first mode, the fourth switch 204 is turned on, the first switch 202 is turned on, the second switch 203 is turned off, and the fifth switch 215 is turned off, allowing the voltage Vprg to be applied to the gate of the memory cell 207 via the row decoder 102. Also, the output voltage Vreg of the regulator 201 is coupled to the gate of the voltage applying transistor 205, and a voltage obtained by controlling the boosted voltage VPP2 with the output voltage Vreg of the regulator 201 is applied to the drain side of the memory cell 207 via the parasitic resistances R1 and R2 and the selective transistor 206.

In the second mode, the first switch 202 is turned off, the second switch 203 is turned on, the fourth switch 204 is turned off, and the fifth switch 215 is turned on, allowing the output voltage Vreg of the regulator 201 to be applied to the gate of the memory cell 207 via the row decoder 102. Also, the voltage Vread generated by the voltage generator circuit in the circuit block 216 is supplied to the source side of the memory cell 207 via the parasitic resistances R1 and R2 and the selective transistor 206. The sense amplifier in the circuit block 216 determines the state of the memory cell 207 from a difference in the current flowing at this time.

The first mode represents write operation, and the second mode represents read operation.

As described above, according to the present disclosure, one regulator can be used as both the regulator for the drain voltage of the memory cell used in the first mode and the regulator for the gate voltage of the memory cell used in the second mode. Therefore, the present disclosure is useful as a small-area semiconductor memory device, and is applicable to microcomputers having such semiconductor memory devices.

What is claimed is:

1. A semiconductor memory device capable of erasing and writing memory contents in a memory cell using an electric signal, comprising:
    the memory cell, one regulator, first and second switches, and a voltage applying transistor for applying a voltage to the memory cell,
    wherein
    an output of the regulator is coupled to inputs of the first and second switches,
    an output of the first switch is coupled to a gate of the voltage applying transistor,
    a voltage is applied from a drain terminal of the voltage applying transistor to a drain terminal of the memory cell, and
    an output of the second switch is coupled to a gate of the memory cell for application of a voltage.

2. A semiconductor memory device capable of erasing and writing memory contents in a memory cell using an electric signal, comprising:
    the memory cell, one regulator, second and third switches, and a voltage applying transistor,
    wherein
    an output of the regulator is coupled to an input of the second switch and a gate of the voltage applying transistor,
    a voltage is applied from a drain terminal of the voltage applying transistor to a drain terminal of the memory cell via the third switch, and
    an output of the second switch is coupled to a gate of the memory cell for application of a voltage.

3. The semiconductor memory device of claim 1, wherein an output of a fourth switch is coupled to the output of the second switch, and
    a voltage different from the output of the regulator is applied to the gate of the memory cell.

4. The semiconductor memory device of claim 2, wherein an output of a fourth switch is coupled to the output of the second switch, and
    a voltage different from the output of the regulator is applied to the gate of the memory cell.

5. The semiconductor memory device of claim 3, wherein in a first operation mode, the first and fourth switches are turned on, allowing the output voltage of the regulator to be applied to the drain terminal of the memory cell and the voltage different from the output of the regulator to be applied to the gate of the memory cell, and
    in a second operation mode, the second switch is turned on, allowing the output voltage of the regulator to be applied to the gate of the memory cell.

6. The semiconductor memory device of claim 4, wherein in a first operation mode, the third and fourth switches are turned on, allowing the output voltage of the regulator to be applied to the drain terminal of the memory cell and the voltage different from the output of the regulator to be applied to the gate of the memory cell, and
    in a second operation mode, the second switch is turned on, allowing the output voltage of the regulator to be applied to the gate of the memory cell.

7. The semiconductor memory device of claim 1, further comprising:
    fifth and sixth switches, a grounding transistor, a sense amplifier, and a voltage generator circuit,
    wherein
    an input of the fifth switch is coupled between the drain terminal of the voltage applying transistor and the drain terminal of the memory cell, and an input of the sense amplifier is coupled to an output of the fifth switch,
    a source terminal of the memory cell is grounded via the grounding transistor,
    an output of the sixth switch is coupled between the source terminal of the memory cell and the grounding transistor, and
    an output of the voltage generator circuit is coupled to an input of the sixth switch.

8. The semiconductor memory device of claim 2, further comprising:
    fifth and sixth switches, a grounding transistor, a sense amplifier, and a voltage generator circuit,
    wherein
    an input of the fifth switch is coupled between the third switch and the drain terminal of the memory cell, and an input of the sense amplifier is coupled to an output of the fifth switch,
    a source terminal of the memory cell is grounded via the grounding transistor,
    an output of the sixth switch is coupled between the source terminal of the memory cell and the grounding transistor, and
    an output of the voltage generator circuit is coupled to an input of the sixth switch.

9. The semiconductor memory device of claim 1, further comprising:
    fifth and sixth switches, a grounding transistor, a sense amplifier, and a voltage generator circuit,
    wherein
    an output of the fifth switch is coupled between the drain terminal of the voltage applying transistor and the drain terminal of the memory cell, and an output of the voltage generator circuit is coupled to an input of the fifth switch,
    a source terminal of the memory cell is grounded via the grounding transistor,
    an input of the sixth switch is coupled between the source terminal of the memory cell and the grounding transistor, and
    an input of the sense amplifier is coupled to an output of the sixth switch.

10. The semiconductor memory device of claim 2, further comprising:
fifth and sixth switches, a grounding transistor, a sense amplifier, and a voltage generator circuit,
wherein
an output of the fifth switch is coupled between the third switch and the drain terminal of the memory cell, and an output of the voltage generator circuit is coupled to an input of the fifth switch,
a source terminal of the memory cell is grounded via the grounding transistor,
an input of the sixth switch is coupled between the source terminal of the memory cell and the grounding transistor, and
an input of the sense amplifier is coupled to an output of the sixth switch.

11. The semiconductor memory device of claim 1, further comprising:
a fifth switch, a sense amplifier, and a voltage generator circuit,
wherein
an output of the fifth switch is coupled between the drain terminal of the voltage applying transistor and the drain terminal of the memory cell, and an output of the voltage generator circuit and an input of the sense amplifier are coupled to an input of the fifth switch, and
a source terminal of the memory cell is grounded.

12. The semiconductor memory device of claim 2, further comprising:
a fifth switch, a sense amplifier, and a voltage generator circuit,
wherein
an output of the fifth switch is coupled between the third switch and the drain terminal of the memory cell, and an output of the voltage generator circuit and an input of the sense amplifier are coupled to an input of the fifth switch, and
a source terminal of the memory cell is grounded.

13. The semiconductor memory device of claim 7, wherein
in a first operation mode, the first and fourth switches and the grounding transistor are turned on, allowing the output voltage of the regulator to be applied to the drain terminal of the memory cell, the voltage different from the output of the regulator to be applied to the gate of the memory cell, and a source of the memory cell to be grounded, and
in a second operation mode, the second, fifth, and sixth switches are turned on, allowing the input of the sense amplifier to be coupled to the drain terminal of the memory cell, the output voltage of the regulator to be applied to the gate of the memory cell, and the output voltage of the voltage generator circuit to be applied to the source of the memory cell.

14. The semiconductor memory device of claim 8, wherein
in a first operation mode, the third and fourth switches and the grounding transistor are turned on, allowing the output voltage of the regulator to be applied to the drain terminal of the memory cell, the voltage different from the output of the regulator to be applied to the gate of the memory cell, and a source of the memory cell to be grounded, and
in a second operation mode, the second, fifth, and sixth switches are turned on, allowing the input of the sense amplifier to be coupled to the drain terminal of the memory cell, the output voltage of the regulator to be applied to the gate of the memory cell, and the output voltage of the voltage generator circuit to be applied to the source of the memory cell.

15. The semiconductor memory device of claim 9, wherein
in a first operation mode, the first and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and
in a second operation mode, the second, fifth, and sixth switches are turned on, allowing the output voltage of the voltage generator circuit to be applied to the drain terminal of the memory cell, the output voltage of the regulator to be applied to the gate of the memory cell, and the input of the sense amplifier to be coupled to the source terminal of the memory cell.

16. The semiconductor memory device of claim 10, wherein
in a first operation mode, the third and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and
in a second operation mode, the second, fifth, and sixth switches are turned on, allowing the output voltage of the voltage generator circuit to be applied to the drain terminal of the memory cell, the output voltage of the regulator to be applied to the gate of the memory cell, and the input of the sense amplifier to be coupled to the source terminal of the memory cell.

17. The semiconductor memory device of claim 11, wherein
in a first operation mode, the first and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and
in a second operation mode, the second and fifth switches are turned on, allowing the output voltage of the voltage generator circuit to be applied to the drain terminal of the memory cell, as well as the input of the sense amplifier to be coupled to the drain terminal of the memory cell, and the output voltage of the regulator to be applied to the gate of the memory cell.

18. The semiconductor memory device of claim 12, wherein
in a first operation mode, the third and fourth switches and the grounding transistor are turned on, allowing the output voltage of the regulator to be applied to the drain terminal of the memory cell, the voltage different from the output of the regulator to be applied to the gate of the memory cell, and the source of the memory cell to be grounded, and
in a second operation mode, the second and fifth switches are turned on, allowing the output voltage of the voltage generator circuit to be applied to the drain terminal of the memory cell, as well as the input of the sense amplifier to be coupled to the drain terminal of the memory cell, and the output voltage of the regulator to be applied to the gate of the memory cell.

19. The semiconductor memory device of claim 5, wherein the first operation mode represents write into the memory cell, and the second operation mode represents read of memory cell information.

20. The semiconductor memory device of claim 3, wherein the voltage different from the output of the regulator is an output voltage of a booster circuit.

21. The semiconductor memory device of claim 1, wherein an output of a booster circuit is coupled to a source terminal of the voltage applying transistor.

* * * * *